United States Patent
McCallister (10) Patent No.: US 9,031,520 B2
(45) Date of Patent: May 12, 2015

(54) TRANSMITTER AND METHOD WITH RF POWER AMPLIFIER HAVING CONTROL LOOP STABILIZED BIAS

(71) Applicant: CrestCom, Inc., Scottsdale, AZ (US)

(72) Inventor: Ronald Duane McCallister, Scottsdale, AZ (US)

(73) Assignee: CrestCom, Inc., Scottsdale, AZ (US)

( * ) Notice: Subject to any disclaimer, the term of this patent is extended or adjusted under 35 U.S.C. 154(b) by 77 days.

(21) Appl. No.: 13/940,042

(22) Filed: Jul. 11, 2013

(65) Prior Publication Data

US 2015/0017933 A1 Jan. 15, 2015

(51) Int. Cl.
*H04B 1/04* (2006.01)

(52) U.S. Cl.
CPC .................. *H04B 1/0475* (2013.01)

(58) Field of Classification Search
USPC ........... 455/91, 114.1, 114.2, 114.3, 115.1, 455/126, 127.1, 127.2, 127.3; 375/295, 296
See application file for complete search history.

(56) References Cited

U.S. PATENT DOCUMENTS

| | | | |
|---|---|---|---|
| 7,570,931 | B2 | 8/2009 | McCallister et al. |
| 8,093,946 | B2 | 1/2012 | Wimpenny et al. |
| 2003/0146790 | A1 | 8/2003 | Arell et al. |
| 2007/0087707 | A1* | 4/2007 | Blair et al. ............... 455/127.1 |
| 2007/0178856 | A1* | 8/2007 | Mitzlaff et al. .......... 455/127.1 |
| 2007/0281635 | A1 | 12/2007 | McCallister et al. |
| 2009/0273399 | A1 | 11/2009 | Wang |
| 2010/0184389 | A1 | 7/2010 | Fraysse et al. |
| 2011/0018632 | A1 | 1/2011 | Pletcher et al. |
| 2012/0106676 | A1 | 5/2012 | McCallister et al. |
| 2012/0286873 | A1 | 11/2012 | Li et al. |
| 2013/0027129 | A1 | 1/2013 | Langer |

OTHER PUBLICATIONS

P. Asbeck et al., "Efficiency and Linearity Improvement in Power Amplifiers for Wireless Communications", Gallium Arsenide Integrated Circuit (GaAs IC) Symposium, Nov. 1-4, 1998, pp. 15-18, University of California, CA.

Jinsung Choi et al., "A Polar Transmitter With CMOS Programmable Hysteretic-Controlled Hybrid Switching Supply Modulator for Multistandard Applications", IEEE Transactions on Microwave Theory and Techniques, Jul. 2009, pp. 1675-1686, vol. 57, No. 7, USA.

(Continued)

*Primary Examiner* — Thanh Le
(74) *Attorney, Agent, or Firm* — Schmeiser, Olsen & Watts LLP; Lowell W. Gresham (57) ABSTRACT

A transmitter (32) generates a time-varying stabilized bias signal (82) from which an amplifier-generated, sub-RF distortion signal (26) has been canceled. The distortion signal (26) is a byproduct of amplification and is generated due to imperfect linearity and/or other characteristics of a linear RF power amplifier (36). An envelope amplifier (84) includes a high bandwidth differential input, linear, bias signal amplifier (120) and a low bandwidth switching amplifier (122) coupled together to achieve both a high bandwidth and high efficiency. A control loop (154) feeds a portion of the voltage V(t) from a conduction node (146) of the RF power amplifier (36) to one of the differential inputs of the linear bias signal amplifier (120), while a bias control signal (92) drives the other differential input. The portion of voltage V(t) fed to bias signal amplifier (120) is a low power portion from which the RF portion has been removed.

20 Claims, 5 Drawing Sheets

(56) References Cited

OTHER PUBLICATIONS

Christian Fager et al., "A Comprehensive Analysis of IMD Behavior in RF CMOS Power Amplifiers", IEEE Journal of Solid-State Circuits, Jan. 2004, pp. 24-34, vol. 39, No. 1, USA.
Gary Hanington et al., "High-Efficiency Power Amplifier Using Dynamic Power-Supply Voltage for CDMA Applications", IEEE Transactions on Microwave Theory and Techniques, Aug. 1999, pp. 1471-1476, vol. 47, No. 8, USA.
Muhammad Hassan et al., "A CMOS Dual-Switching Power-Supply Modulator with 8% Efficiency Improvement for 20MHz LTE Envelope Tracking RF Power Amplifiers", 2013 IEEE International Solid-State Circuits Conference, 2013, pp. 366-368, USA.
Muhammad Hassan et al., "A Wideband CMOS/GaAs HBT Envelope Tracking Power Amplifier for 4G LTE Mobile Terminal Applications", IEEE Transactions on Microwave Theory and Techniques, May 2012, pp. 1321-1330, vol. 60, No. 5, USA.
Jim Holdahl et al., "Demystifying Buck Inductors", Jul. 1, 2001, pp. 1-3, Powerelectronics.com.
Chin Hsia, "Envelope Amplifier Design for Wireless Base-Station Power Amplifiers", A dissertation submitted in partial satisfaction of the requirements for the degree Doctor of Philosophy, 2010, pp. 1-149, University of California, San Diego.
Jinseong Jeong et al., "High-Efficiency WCDMA Envelope Tracking Base-Station Amplifier Implemented With GaAs HVHBTs", IEEE Journal of Solid State Circuits, Oct. 2009, pp. 2629-2639, vol. 44, No. 10, USA.
Jinseong Joeng et al., "Modeling and Design of RF Amplifiers for Envelope Tracking WCDMA Base-Station Applications", IEEE Transactions on Microwave Theory and Techniques, Sep. 2009, pp. 2148-2159, vol. 57, No. 9, USA.
Jinseong Jeong et al., "Wideband Envelope Tracking Power Amplifiers With Reduced Bandwidth Power Supply Waveforms and Adaptive Digital Predistortion Techniques", IEEE Transactions on Microwave Theory and Techniques, Dec. 2009, pp. 3307-3314, vol. 57, No. 12, USA.
Donald F. Kimball et al., "High-Efficiency Envelope-Tracking W-CDMA Base-Station Amplifier Using GaN HFETs", IEEE Transactions on Microwave Theory and Techniques, Nov. 2006, pp. 3848-3856, vol. 54, No. 11, USA.
Myoungbo Kwak et al., "Design of a Wideband High-Voltage High-Efficiency BiCMOS Envelope Amplifier for Micro-Base-Station RF Power Amplifiers", IEEE Transactions on Microwave Theory and Techniques, Jun. 2012, pp. 1850-1861, vol. 60, No. 6, USA.
Vincent W. Leung et al., "Analysis of Envelope Signal Injection for Improvement of RF Amplifier Intermodulation Distortion", IEEE Journal of Solid-State Circuits, Sep. 2005, pp. 1888-1894, vol. 40, No. 9, USA.
Nitronex, NPT2010, Gallium Nitride 48V, 100W, DC-2.2 GHz HEMT, Data Sheet, 2013, pp. 1-10, USA.
Sumitomo Electric, EGN21C320IV, Data Sheet, Edition 2, May 2013, pp. 1-8, USA.
Peter Asbech et al., "CMOS Handset Power Amplifiers: Directions for the Future", Custom Integrated Circuits Conference (CICC), 2012 IEEE, Sep. 9-12, pp. 1-6, San Jose, CA.
Feipeng Wang et al., "A Monolithic High-Efficiency 2.4-GHz 20-dBm SiGe BiCMOS Envelope-Tracking OFDM Power Amplifier", IEEE Journal of Solid-State Circuits, Jun. 2007, pp. 1271-1281, vol. 42, No. 6, USA.
Patent Cooperation Treaty, International Search Report and Written Opinion of International Application No. PCT/US14/45939, Jan. 2, 2015, pp. 1-16, ISA/US.

* cited by examiner

TRANSMITTER AND METHOD WITH RF POWER AMPLIFIER HAVING CONTROL LOOP STABILIZED BIAS

TECHNICAL FIELD OF THE INVENTION

The present invention relates generally to the field of radio-frequency (RF) communication systems. Specifically, the present invention relates to RF transmitters that stabilize RF power amplifier biasing signals to improve transmitter linearity and power added efficiency.

BACKGROUND OF THE INVENTION

An RF power amplifier provides the final stage of amplification for a communication signal that has been modulated and converted into an RF signal. Often that RF signal exhibits frequencies in a predetermined RF frequency band licensed by a regulatory agency for a particular use. The RF power amplifier boosts the power of this RF communication signal to a level sufficient so that the signal, when it propagates to an antenna, will be broadcast in such a manner that it will meet the communication goals of the RF transmitter.

Many popular modern modulation techniques, such as CDMA, QAM, OFDM, and the like, require the RF power amplifier to perform a linear amplification operation. In other words, the RF communication signal conveys both amplitude and phase information, and the RF power amplifier should faithfully reproduce both the amplitude and phase content of the RF signal presented to it. While perfect linearity is a goal for any linear RF power amplifier, all linear RF power amplifiers invariably fail to meet it. The degree to which the goal of perfect linearity is missed leads to unwanted intermodulation, distortion, and spectral regrowth. Spectral regrowth refers to an expansion of the bandwidth of an RF communication signal. Governmental regulatory agencies define spectral masks which impose stringent constraints on the spectral emissions from transmitters. Even small amounts of spectral regrowth can cause the transmitter to violate regulatory requirements.

Those who design RF transmitters understand that different RF power amplifier limitations lead, directly and indirectly, to different types of nonlinearities. One of these nonlinearities results indirectly from an unwanted amplifier-generated low-frequency distortion signal referred to as a video signal. In particular, RF power amplifiers tend to generate unwanted harmonics of the fundamental RF communication signal being amplified along with the desired amplified fundamental RF communication signal. Filters are often used to remove or otherwise block the harmonics from being broadcast from the transmitter. But the even harmonics have sub-RF byproducts below the fundamental in frequency, extending upward from zero Hz. In some RF power amplifiers, the even harmonics and their sub-RF byproducts may be less prominent, but other mechanisms are present to generate other forms of sub-RF distortion. This sub-RF, amplifier-generated distortion signal represents the sub-RF energy that extends upward from zero Hz. While the amplifier-generated sub-RF distortion signal is not broadcast from the transmitter, it may nevertheless cause problems.

A typical RF amplifier uses an RF amplifying device which is fed a biasing voltage through a biasing network. The sub-RF distortion signal causes a time-varying voltage to develop across the biasing network, which causes a corresponding and unwanted time-varying voltage modulation of the bias voltage applied across conduction nodes of the RF amplifying device. This unwanted bias modulation leads to an unwanted intermodulation between the sub-RF distortion signal and the RF fundamental signal. The intermodulation causes the RF power amplifier to generate an RF distortion signal which resides in the bandwidth of the fundamental RF signal and extends outside the bandwidth of the fundamental RF signal. This type of distortion is undesirable because it reduces the signal-to-noise ratio of the transmitted RF signal. But it is highly undesirable due to the spectral regrowth which often must be corrected in order for the transmitter to comply with its spectral mask. Thus, the sub-RF distortion signal causes the RF amplifying device's bias signal to be less stable than desired. Without this sub-RF distortion signal form of bias corruption, linearity would improve.

Conventional transmitters have addressed the sub-RF distortion signal problem in at least a couple of different ways. In one way, the biasing network is configured to implement a series of resonant impedance notches distributed throughout a bandwidth of the sub-RF distortion signal. This technique lowers the overall impedance of the bias network in the sub-RF distortion signal bandwidth, which in turn attenuates or otherwise somewhat stabilizes the sub-RF distortion signal and reduces the unwanted intermodulation. Unfortunately, this technique does not work well for wide bandwidth signals. One of the requirements of a bias network is to exhibit very high impedance to the amplified fundamental RF signal. For wide bandwidth communication signals it becomes increasingly difficult to configure a biasing network to exhibit adequately low impedance throughout a wide sub-RF distortion signal bandwidth yet exhibit adequately high impedance at the fundamental RF frequency. And, the inclusion of resonant notches in the biasing network is undesirable because it worsens another type of nonlinearity, referred to as "memory effects". The memory-effect nonlinearities are particularly undesirable because they are difficult to compensate using predistortion techniques which require reasonable computational abilities and consume little power.

In accordance with another technique for addressing the sub-RF distortion signal problem, baseband digital signal processing circuits predict the bias signal corruption that will be caused by the sub-RF distortion signal, then predistort the digital baseband form of the communication signal in a way that will, after upconversion and amplification in the RF power amplifier, compensate for the intermodulation distortion that the sub-RF distortion signal causes. This technique does not rely upon the use of several sub-RF distortion signal bandwidth resonant notches in the biasing network and is effective in reducing the unwanted intermodulation distortion caused by the sub-RF distortion signal. But the bias signal fed to the amplifying device remains less stable in the sub-RF distortion bandwidth than desired.

In addition to linearity requirements set through spectral masks, power-added efficiency (PAE) is another parameter of interest to those who design RF transmitters. PAE is the ratio of the RF output power to the sum of the input RF power and the applied bias-signal power. An amplifier that has low PAE wastes power, which is undesirable in any transmitter, but particularly undesirable in battery-powered transmitters because it necessitates the use of undesirably large batteries and/or undesirably frequent recharges. Conventionally, improvements in PAE have been achieved at the expense of linearity. But envelope-tracking (ET) techniques, envelope elimination and restoration (EER) techniques, and hybrids between the two techniques have shown promise for achieving PAE improvements. When such techniques are combined with conventional digital predistortion techniques, the RF power amplifiers may also achieve modest amounts of linearity.

Generally, envelope tracking (ET), envelope elimination and restoration (EER), and hybrids of the two refer to techniques for biasing an RF power amplifier using a time-varying signal that at least roughly tracks the envelope of the RF communication signal. The goal of such techniques is to provide a bias signal to a bias feed network that maintains the bias voltage and current between the conduction nodes of the RF amplifying device at a level no greater than it needs to be to achieve respectably linear amplification. Conventional transmitters contemplate the use of predistortion to compensate for the nonlinearity that will result from the use of a time-varying bias feed signal rather than a constant signal.

Unfortunately, the sub-RF distortion signal is believed to add a component of bias instability which prevents envelope tracking techniques from achieving desired levels of improvement in PAE.

What is needed is an RF transmitter having an RF power amplifier that achieves both improved PAE and improved linearity by stabilizing the bias applied to RF amplifying devices and by avoiding the excessive use of resonant notches in the biasing network.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
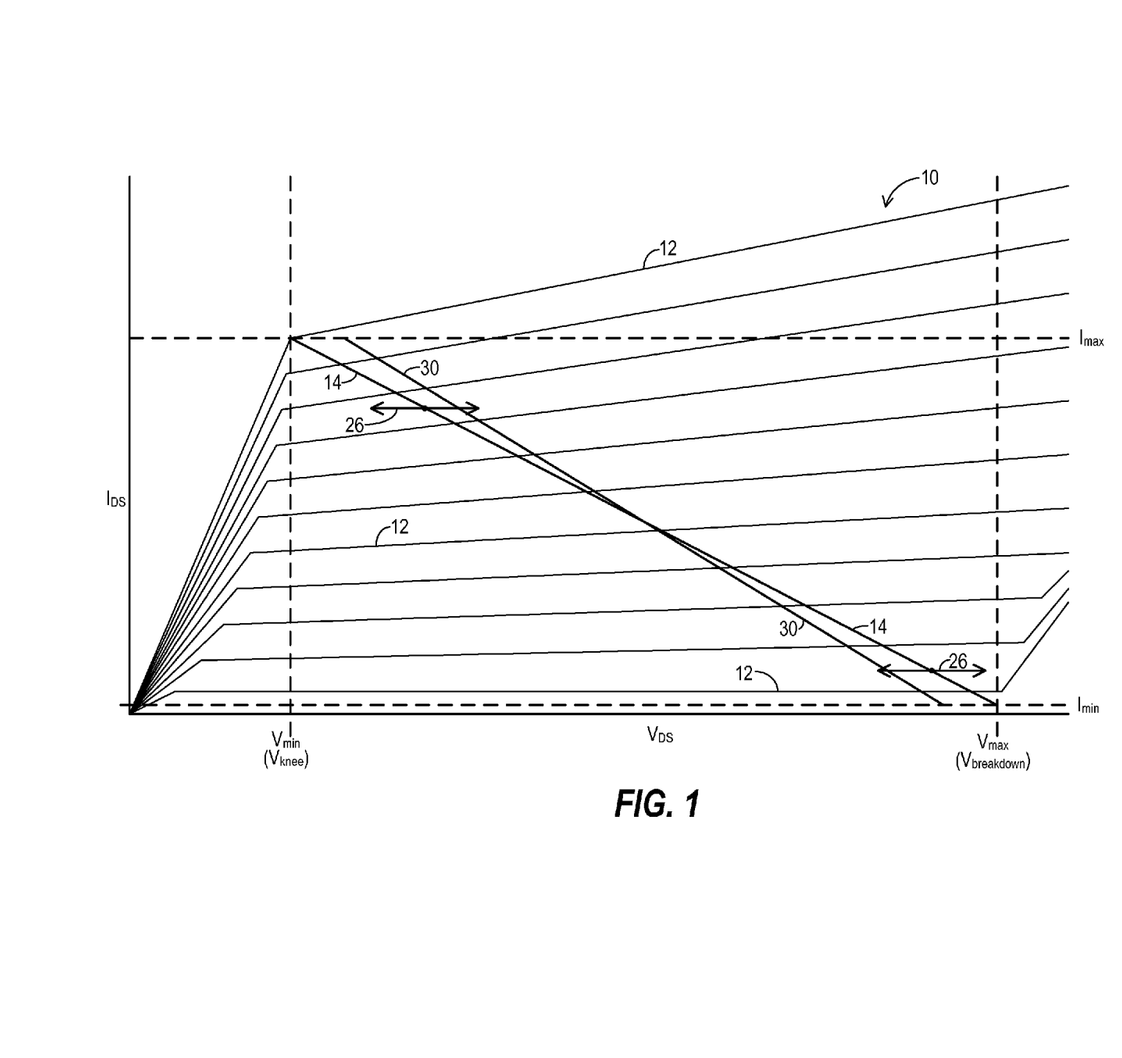
FIG. 1 shows a chart depicting a representative family of transfer characteristics of a representative RF power amplifier.

FIG. 1 shows a chart depicting a representative family 10 of transfer curves 12 for a representative RF amplifying device (not shown) using field effect transistor (FET) nomenclature. The basic relationships shown in FIG. 1 apply to other types of RF amplifying devices as well. Current $I_{DS}$ flowing through a conduction channel of the RF amplifying device between its drain and source conduction nodes is represented along the vertical axis, and voltage $V_{DS}$ across the drain and source conduction nodes is represented along the horizontal axis. A different transfer curve 12 is presented for each of several different levels for an input signal $V_{GS}$ presented to the RF amplifying device across gate and source nodes.

An optimal load line 14 extends between the knee voltage ($V_{knee}$) for $V_{DS}$ at a high level of input signal $V_{GS}$, and the breakdown voltage ($V_{breakdown}$) for $V_{DS}$ at a lower level of the input signal $V_{GS}$. Optimal load line 14 is defined by amplifier characteristics in combination with the load applied at the output of the amplifier. At an upper left-most point on optimal load line 14, the RF amplifying device's conduction channel is at high current $I_{DS}$ but low voltage $V_{DS}$. At a lower right-most point for optimal load line 14, the RF amplifying device's conduction channel is at low current $I_{DS}$ but high voltage $V_{DS}$. By configuring the load for the RF amplifying device and biasing the RF amplifying device so that its conduction channel characteristics remain on optimal load line 14, the RF amplifying device may do a respectable job of linear amplification. That respectable job may nevertheless be improved through predistortion and other linearization techniques which take place outside the RF amplifying device itself. But if the RF amplifying device is allowed to operate at a $V_{DS}$ less than $V_{knee}$ and/or a $V_{DS}$ greater than $V_{breakdown}$, then the amplification operation becomes characterized by a substantial degree of nonlinearity. Conventional linearization techniques may have little or no ability to compensate for this substantial degree of nonlinearity, so operation beyond the $V_{knee}$ and $V_{breakdown}$ points is desirably avoided.

Power added efficiency (PAE) improves by biasing the RF amplifying device so that the amplified RF waveform traverses the entirety of optimal load line 14 during each cycle of the RF waveform. In order to optimize both linearity and PAE, the RF amplifying device should operate over the entirety of optimal load line 14, and refrain from operating beyond the ends of optimal load line 14. When the envelope or magnitude of the RF signal being amplified changes, then biasing signals may correspondingly change so that the RF waveform at the changed envelope level continues to traverse the entirety of optimal load line 14 for the changed biasing scenario to achieve a desirably high PAE, and only traverse load line 14 to support linearity. This changing of the bias signals to track the envelope and raise PAE is the goal of envelope tracking (ET), envelope elimination and restoration (EER) and hybrid techniques of RF amplifier biasing.

Even when operating the RF amplifying device within the confines of optimal load line 14, the amplifying operation may be imperfectly linear. Imperfect linearity may cause the RF amplifying device to generate harmonics of the fundamental RF communication signal being amplified. The RF amplifying device may even exhibit a significant square-law dependence on $V_{GS}$ in addition to a linear dependence. And, the RF amplifying device may generate sub-RF byproduct distortion signals through other means than the generation of even harmonics.

Figure 2:
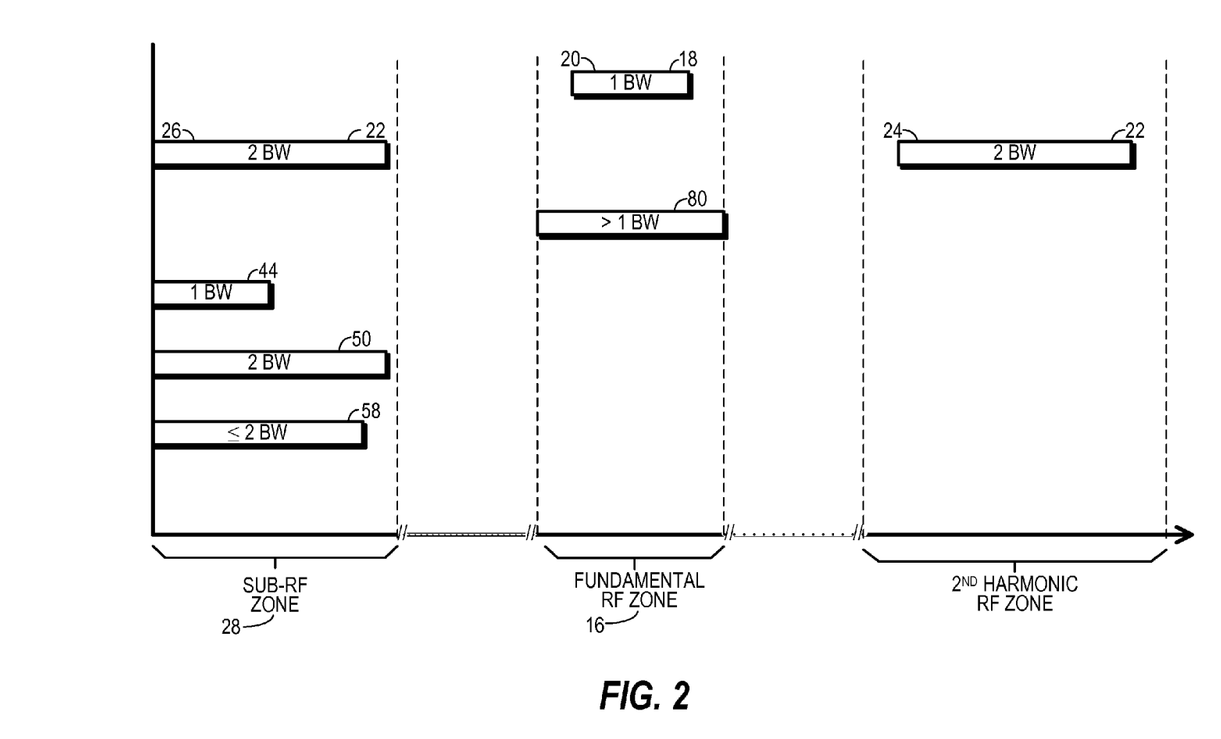
FIG. 2 shows a chart of three different zones of the electromagnetic spectrum and of relative bandwidths of signals discussed in connection with FIGS. 1-5.

FIG. 2 shows a chart of three different zones of the electromagnetic spectrum and of relative bandwidths of signals discussed in connection with FIGS. 1-5. A fundamental RF zone 16 represents one of these three zones. Fundamental RF zone 16 is the portion of the electromagnetic spectrum where a transmitter that employs the RF amplifying device is designed and/or authorized to operate. The transmitter may transmit at a full authorized power within and throughout a single fundamental bandwidth 18 located in fundamental RF zone 16. But to the extent that the RF amplifying device is imperfectly linear and/or exhibits a square-law dependence on $V_{GS}$, harmonics of a fundamental RF signal 20 will be generated. While any number of harmonics in varying degrees of strength may be generated as a byproduct of the amplification process, a second harmonic 22 may be the most prominent. Second harmonic 22 represents unwanted energy or distortion in the amplified signal. The second harmonic is responsible for a second harmonic distortion signal 24 and a sub-RF distortion signal 26. Second harmonic distortion signal 24 is located at twice the frequency of fundamental bandwidth 18 and exhibits roughly twice the bandwidth of fundamental bandwidth 18. Sub-RF distortion signal 26 extends upward in frequency from zero Hz for two or more spans of fundamental bandwidth 18 but not so far as to reach fundamental RF zone 16. Sub-RF distortion signal 26 resides in a sub-RF zone 28 of the electromagnetic spectrum that extends upward from zero Hz for a range of a few spans, and desirably at least two spans, of single bandwidth 18. As a result of the amplifying operation, the RF amplifying device generates an amplified signal that is a composite of at least fundamental RF signal 20 second harmonic distortion signal 24, and sub-RF distortion signal 26. To the extent that even ordered harmonics greater than the second harmonic (i.e., fourth, sixth, etc.) are present, they will also have associated sub-RF components that reside in sub-RF zone 28. And, other amplifier characteristics may lead to other forms of sub-RF distortion signal 26 not associated with even harmonics.

Second harmonic distortion signal 24 may be removed or otherwise controlled using filtering, RF traps, and/or other techniques known to those of skill in the art. But sub-RF distortion signal 26 is at least close to the frequency of the bias signals generated for and supplied to the RF amplifying device and may fall squarely in the same bandwidth as bias signals. Thus, sub-RF distortion signal 26 may act like an unwanted bias signal or like bias distortion or corruption. Sub-RF distortion signal 26 destabilizes a bias signal target desired for the RF amplifying device by adding to or being subtracted from the bias signal target. As depicted by right and left extending horizontal arrows in FIG. 1, sub-RF distortion signal 26 alters $V_{DS}$ by being added to and subtracted from $V_{DS}$. As a result of the influence of sub-RF distortion signal 26 on $V_{DS}$, if the RF amplifying device operates on optimal load line 14, significant nonlinearity will result because sub-RF distortion signal 26 will often push $V_{DS}$ below $V_{knee}$ and above $V_{breakdown}$.

In order to avoid this significant nonlinearity, the RF amplifying device may be operated on a sub-optimal load line 30. At sub-optimal load line 30, in spite of the fluctuation or instability of $V_{DS}$ in response to the sub-RF distortion signal 26, the amplification operation of the RF amplifying device remains substantially linear. But sub-optimal load line 30 detunes the RF amplifying device away from optimal PAE performance to avoid significant nonlinearity. As the amplified signal generated by the RF amplifying device contains a higher proportion of second and higher even-ordered harmonics, the more sub-optimal load line 30 must be detuned away from optimal PAE performance.

Figure 3:
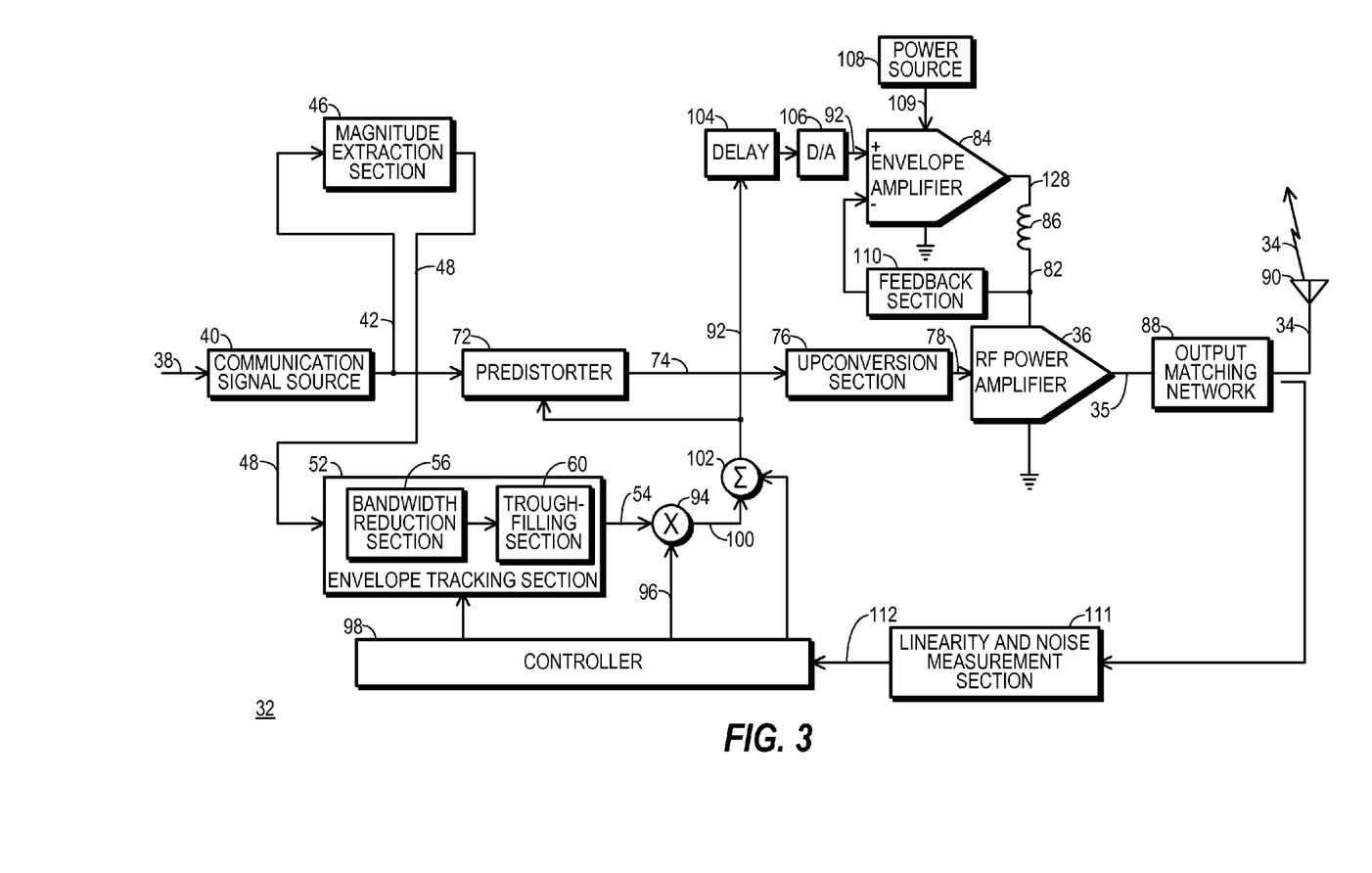
FIG. 3 shows a simplified block diagram of a transmitter configured in accordance with one embodiment of the present invention.
Figure 4:
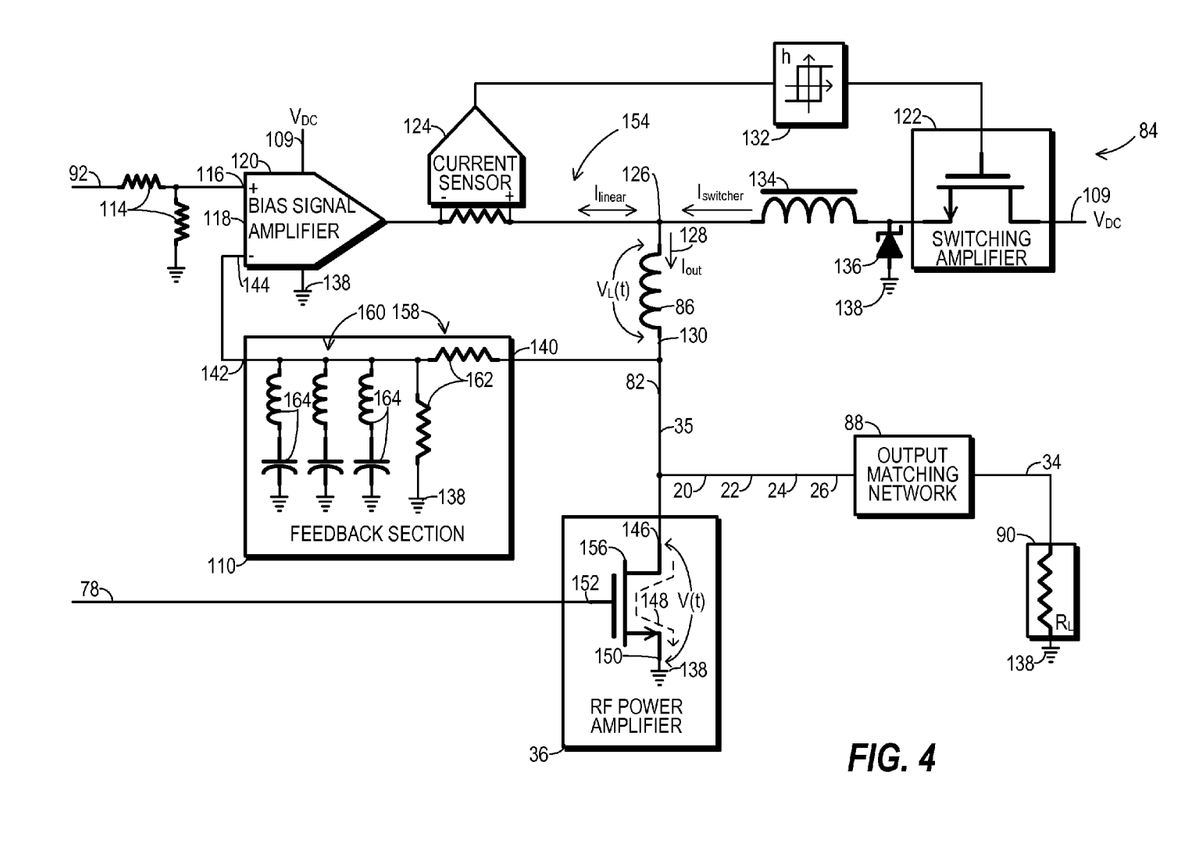
FIG. 4 shows a simplified block diagram of one embodiment of RF and biasing sections used by the transmitter of FIG. 3.
Figure 5:
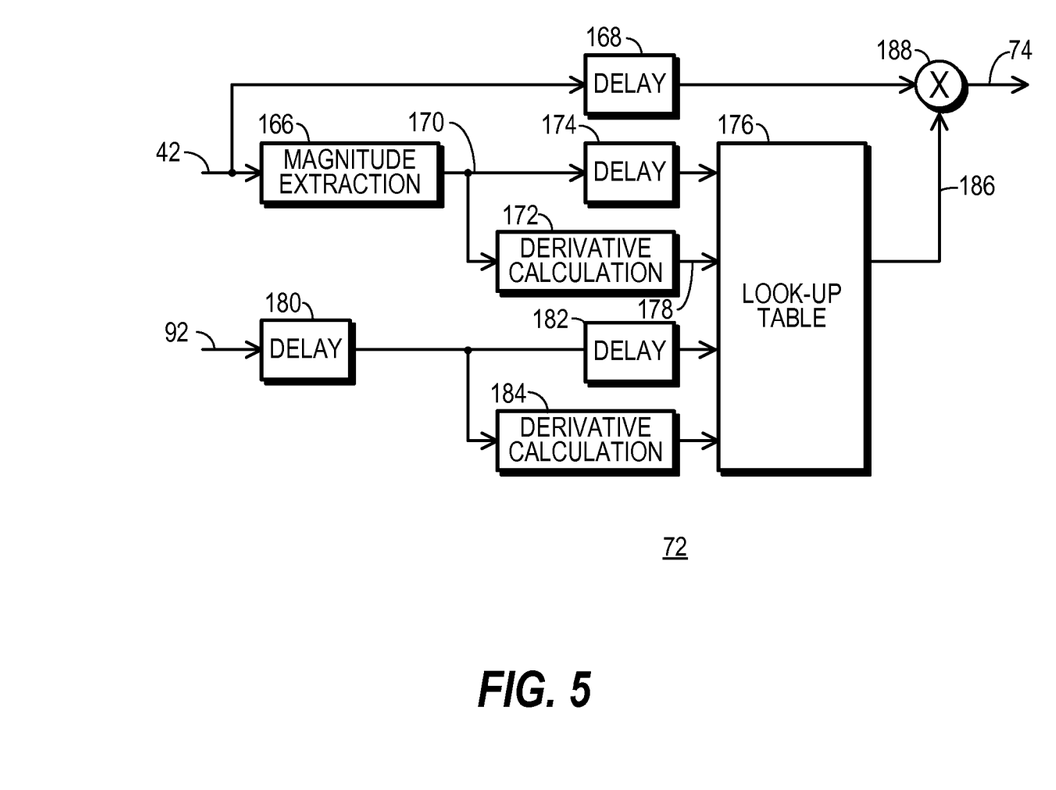
FIG. 5 shows a simplified block diagram of one embodiment of a predistorter portion of the transmitter of FIG. 3.

FIGS. 3-5 describe an alternate approach which reduces the influence of sub-RF distortion signal 26 on $V_{DS}$ to permit linear operation of the RF amplifying device closer to optimal load line 14 (FIG. 1) than sub-optimal load line 30. FIG. 3 shows a simplified block diagram of a transmitter 32 configured in accordance with one embodiment of the present invention. In the embodiment explicitly depicted in FIG. 3, transmitter 32 is configured to wirelessly transmit an amplified RF communication signal 34. Transmitter 32 is configured to employ a linear, envelope tracking (ET), RF power amplifier 36, which is discussed in more detail below in connection with FIG. 4.

Upstream of RF power amplifier 36, transmitter 32 receives one or more user data streams 38 at an input to a communication signal source 40. Communication signal source 40 provides a digitally modulated, complex, baseband version of a communication signal 42. For the purposes of this discussion, any communication signal, such as communication signal 42 and others discussed below, is an electronic signal that may undergo a variety of different processing stages and be represented in a variety of different ways, including as one or more digital streams of data or as one or more analog signals. A communication signal has been modulated with information and/or data provided by user data stream(s) 38. The transmission of this information and/or data is the primary purpose of transmitter 32, and a communication signal could be demodulated or otherwise processed to recover the information and/or data. While a communication signal may have experienced a wide variety of processing stages, such stages have not destroyed the information and/or data conveyed in amplitude and phase so that such information and/or data would be unrecoverable.

Communication signal source 40 may perform any number of activities well known to those skilled in the art of digital transmitters. For example, user data stream 38 may be digitally modulated using a suitable form of digital modulation, such as QPSK, CDMA, OFDM, or the like. Multiple data streams 38 may have been digitally modulated and combined together for transmission, as is common in a cellular base station, or a single data stream 38 may have been digitally modulated for transmission, as is common in an end-user's wireless device, such as a cell phone, touchpad, laptop, netbook, electronic book reader, wireless network adapter, wireless router, and the like. The digitally modulated signal may have been pulse shaped to limit bandwidth while minimizing intersymbol interference (ISI). Some of the processing performed by communication signal source 40 may inflate the peaks of the communication signal compared to what the peaks might have otherwise been. But communication signal source 40 may also include processing circuits to reduce the peaks or otherwise reduce the peak to average power ratio (PAPR) of baseband communication signal 42. Any or all of these and other types of signal processing activities conventionally employed on baseband digital communication signals may be performed at communication signal source 40.

As a result of the processing performed at communication signal source 40, communication signal 42 is a baseband, digitally modulated, complex signal that exhibits a bandwidth 44 (FIG. 2) less than or roughly equal to the span of bandwidth 18 allocated to transmitter 32 for the transmission of RF energy. Bandwidths 18 and 44 are typically set by a governmental agency which controls licensing of the electromagnetic spectrum and devices that use the spectrum. For communication signal 42, bandwidth 44 resides at baseband (i.e., near DC) in the lower half of sub-RF zone 28 (FIG. 2). Desirably, communication signal 42 is an analytic signal having a bandwidth centered at or near 0 Hz.

In accordance with one embodiment of the present invention, transmitter 32 is configured to implement an envelope tracking (ET), envelope elimination and restoration (EER), or hybrid technique (HET) for biasing a conduction channel of RF power amplifier 36 using a time-varying bias signal that loosely, closely, or almost identically follows an envelope of the RF communication signal. In order to form an envelope tracking signal suitable for use in connection with such biasing techniques, baseband communication signal 42 drives a magnitude extraction section 46. Magnitude extraction section 46 extracts a magnitude signal 48 from baseband communication signal 42. In other words, magnitude signal 48 describes the magnitude portion of the digital, complex, baseband form of the communication signal and describes no phase information. Magnitude signal 48 exhibits a double bandwidth 50 (FIG. 2), where baseband communication signal 42 exhibits a single bandwidth 44 (FIG. 2). Magnitude signal 48 also substantially describes the envelope of amplified RF communication signal 34 amplified by RF power amplifier 36 and broadcast from transmitter 32. Magnitude signal 48 drives an input to an envelope tracking section 52, which generates a raw envelope tracking signal 54.

In one embodiment, magnitude signal 48 may, without further processing, serve as raw envelope tracking signal 54, which will be scaled and offset before being used to control a bias signal generated for RF power amplifier 36. In such an embodiment, an optional bandwidth reduction section 56, which is a portion of an envelope tracking section 52, is omitted and raw envelope tracking signal 54 will desirably exhibit double bandwidth 50 (FIG. 2). Such an embodiment is useful when an EER technique is being used to bias RF power amplifier 36. Such an embodiment may also be useful when a hybrid between and EER and ET techniques is being used to bias RF power amplifier 36. In these situations the bias signal being generated for RF power amplifier 36 will closely or almost identically follow magnitude signal 48 and the envelope of RF communication signal 34. A very high PAE may be achieved in these situations.

In another embodiment, bandwidth reduction section 56 is included in envelope tracking section 52, and an output of magnitude extraction section 46 couples to an input of bandwidth reduction section 56. Bandwidth reduction section 56 processes magnitude signal 48 to reduce its bandwidth. The reduced-bandwidth signal generated by bandwidth reduction section 56 may directly serve as raw envelope tracking signal 54, or may be detroughed first. The reduced bandwidth signal exhibits an envelope tracking bandwidth 58 (FIG. 2). Envelope tracking bandwidth 58 is less than or equal to double bandwidth 50 (FIG. 2) exhibited by magnitude signal 48, but the amount of bandwidth reduction is not critical for purposes of the present invention. In some embodiments, envelope tracking bandwidth 58 may exhibit a bandwidth less than single bandwidth 44. This embodiment may be useful when an ET technique or a hybrid between ET and EER techniques is being used to generate the bias signal for RF power amplifier 36. In such applications the bias signal being generated for RF power amplifier 36 will roughly follow magnitude signal 48 and the envelope of amplified RF communication signal 34. A high PAE may still be achieved in these situations; with higher PAE being more easily achievable the more closely raw envelope tracking signal 54 comes to tracking magnitude signal 48 and exhibiting double bandwidth 50.

The use of a reduced bandwidth form of raw envelope tracking signal 54 may be desirable for a couple of different reasons. First, a reduced-bandwidth 58 (FIG. 2) form of a biasing signal may be provided to RF power amplifier 36 by a less expensive and/or more efficient envelope amplifier (discussed below). Second, a reduced-bandwidth 58 form of the biasing signal may place fewer demands on the generation of predistortion.

Envelope tracking section 52 may generate raw envelope tracking signal 54 by following conventional techniques. One example of an envelope tracking section that reduces bandwidths and that may be used in transmitter 32 is described in U.S. Pat. No. 7,570,931, issued 4 Aug. 2009, and entitled "RF Transmitter With Variably Biased RF Power Amplifier And Method Therefor," and is incorporated by reference in its entirety herein. In general, any envelope tracking section directed toward the following three goals may be adequate for the purposes of transmitter 32. First, raw envelope tracking signal 54 should remain at an amplitude greater than or equal to the amplitude of magnitude signal 48 at substantially every sample. Second, raw envelope tracking signal 54 should remain at as low an amplitude as possible for as long as possible without violating the first goal. And third, raw envelope tracking signal 54 may exhibit a reduced bandwidth 58 sufficiently low that a practical and economical implementation of an envelope amplifier (discussed below) can track it and so that a practical and economical digital predistortion circuit (discussed below) may compensate for the distortion the biasing signal causes without violating the first and second goals, but no lower than necessary.

Magnitude signal 48, and/or a reduced bandwidth signal which tracks magnitude signal 48, may exhibit undesirably low troughs, which if used to generate an envelope-tracking bias signal could lead to gain collapse in RF power amplifier 36. Gain collapse is undesirable because it results in unwanted nonlinearity, spectral regrowth, and distortion. Moreover, these unwanted attributes cannot be effectively compensated using conventional predistortion techniques. Accordingly, a trough-filling section 60 is desirably included in envelope tracking section 52 to detrough raw envelope tracking signal 54. Trough-filling section 60 boosts the magnitude of any samples that fall below a threshold that is related to a threshold voltage $V_T$ for RF power amplifier 36. Desirably, the threshold is set so that $V_{DS} \geq V_{GS} + V_T$. Also, desirably, any magnitude boosting performed in trough-filling section 60 is performed in a manner that does not increase the bandwidth of raw envelope tracking signal 54 beyond envelope tracking bandwidth 58.

Baseband communication signal 42 generated by communication signal source 40 also drives a first input of a digital predistorter 72. Predistorter 72 intentionally distorts baseband communication signal 42, converting it into a complex, digital, predistorted baseband communication signal 74. An output of predistorter 72 couples to an input of an upconversion section 76. Predistorter 72 is discussed in more detail below in connection with FIG. 5.

Upconversion section 76 converts predistorted baseband communication signal 74 into a complex analog signal, mixes the analog signal with a pair of RF oscillation signals (not shown) in phase quadrature, and then combines and filters the resulting RF signals into an RF communication signal 78. RF communication signal 78 is positioned in fundamental RF zone 16 (FIG. 2) of the electromagnetic spectrum and roughly exhibits a bandwidth greater than bandwidth 44 (FIG. 2) due to bandwidth expansion occurring in predistorter 72. In addition to the communication signal, RF communication signal 78 desirably includes intentionally introduced distortion configured to compensate for distortions 80 (FIG. 2) in an amplified communication signal 35 directly generated by RF power amplifier 36. Distortions 80 are located in fundamental RF zone 16 and include unwanted intermodulations between signals located in sub-RF zone 28 (FIG. 2) and the wanted RF communication signal located in fundamental RF zone 16 (FIG. 2). The signals located in sub-RF zone 28 include sub-RF distortion signal 26 (FIG. 2) and a time-varying biasing signal generated in response to raw envelope tracking signal 54.

RF communication signal 78 is provided to the input of RF power amplifier 36. At power amplifier 36, amplified communication signal 35 is generated in response to RF communication signal 78 and a stabilized bias signal 82 formed at a conduction node of RF power amplifier 36 when a pre-stabilized bias signal 128 is supplied by an envelope amplifier 84 through an RF choke 86. Either the same or a different conduction node of RF power amplifier 36 serves as an output of RF power amplifier 36. The output of RF power amplifier 36 couples to an output matching network 88, which blocks unwanted harmonics in amplified communication signal 35 and generates amplified RF communication signal 34. From output matching network 88, amplified RF communication signal 34 is transmitted to an antenna 90, from which amplified RF communication signal 34 is broadcast.

Stabilized bias signal 82, formed from pre-stabilized bias signal 128 supplied by envelope amplifier 84 through RF choke 86, is generated in response to a bias control signal 92 supplied to a positive differential input of envelope amplifier 84. Bias control signal 92 is also provided to a second input of predisterter 72. Bias control signal 92 is an enveloping tracking signal, and it is formed from raw envelope tracking signal 54. In particular, raw envelope tracking signal 54 is supplied to a first input of a scaling section 94, and a control signal 96 from a controller 98 drives a second input of scaling section 94. A scaled envelope tracking signal 100 generated by scaling section 94 then drives a first input of an offset section 102, where a second input of offset section 102 is driven by another control signal from controller 98. An output of offset section 102 generates bias control signal 92. Bias control signal 92 drives envelope amplifier 84, after delay in a delay element 104 and conversion into an analog signal in a digital-to-analog (D/A) converter 106. Delay element 104 is configured to temporally align stabilized bias signal 82 with RF communication 78 at RF power amplifier 36.

Other control signal outputs from controller 98 may be provided to envelope tracking section 52 for use in setting a threshold for use in boosting troughs in trough-filling section 60, adjusting bandwidth-limiting parameters for bandwidth reduction section 56, and the like.

Envelope amplifier 84 receives input power from a power source 108. Desirably, power source 108 provides a relatively constant DC voltage 109. Envelope amplifier 84 is configured to convert the input power from power source 108 into stabilized bias signal 82. A feedback section 110 senses a voltage signal at a node between RF choke 86 and RF power amplifier 36 and passes a portion of this voltage signal to a negative differential input of envelope amplifier 84 to form a control loop that causes stabilized bias signal 82 to closely track bias control signal 92. Power source 108 may be, but is not required to be, a battery. A preferred embodiment of an envelope amplifier 84 which is useful in meeting the goals of transmitter 32 is discussed below in connection with FIG. 4.

Amplified RF communication signal 34 is fed back to a linearity and noise measurement section 111. Measurement section 111 desirably down-converts and digitizes signal 34, then processes signal 34 to generate metrics 112. Metrics 112 are applied to an input of controller 98. In response to metrics 112, controller 98 adjusts the control signals it supplies to scaling section 94 and offset section 102. Bias control signal 92 is continuously adjusted to maximize PAE for RF power amplifier 36 while operating transmitter 32 within limits imposed by a spectral mask. Preferably, controller 98 implements different dither control loops having considerably different and substantially uncorrelated dither sequences or having different bandwidths so that the different control loops are substantially independent from one another.

In one embodiment controller 98 monitors metrics 112 to focus upon out-of-band energy located just outside of RF fundamental bandwidth 18 (FIG. 2) in the electromagnetic spectrum. When controller 98 detects a signal level above the amount permitted by the relevant spectral mask for transmitter 32, action is taken to improve linearity. That action may be to adjust scale factors and offsets applied at scaling section 94 and offset section 102 to promote greater linearity. When controller 98 detects an out-of-band signal level below the spectral mask, opposite actions are taken to improve PAE. As a result, control parameters are adjusted to maintain the out-of-band portion of amplified RF communication signal 34 at a substantially constant predetermined power level which complies with the spectral mask, but just barely complies.

FIG. 4 shows a simplified block diagram of one embodiment of RF and biasing sections used in transmitter 32. Bias control signal 92 output from D/A 106 (FIG. 3) in an analog form drives a resistive voltage divider 114 having a central tap coupled to a positive input 116 of a differential input section 118 of a bias signal amplifier 120. Relatively constant DC voltage 109 from power source 108 (FIG. 3) is provided to a power input of bias signal amplifier 120 and to a power input of a switching amplifier 122. An output of bias signal amplifier 120 couples to a first port of a current sensor 124, and a second port of current sensor 124 couples to a first node 126 of RF choke 86. A pre-stabilized, time-varying bias signal 128 is applied to RF choke 86 at first node 126, while a second node 130 of RF choke 86 supplies stabilized bias signal 82 to RF power amplifier 36. An output of current sensor 124 couples to an input of a hysteretic controller 132, and an output of hysteretic controller 132 couples to an input of switching amplifier 122. An output of switching amplifier 122 couples to a first node of a buck inductor 134, and a second node of buck inductor 134 couples to first node 126 of RF choke 86. A protection device 136, such as a Zener diode, couples between the output of switching amplifier 122 and a ground terminal 138 adapted to provide a common potential to protect switching amplifier 122 from high voltage spikes potentially generated by buck inductor 134.

Envelope amplifier 84 includes bias signal amplifier 120, current sensor 124, hysteretic controller 132, switching amplifier 122, buck inductor 134, and related components. Envelope amplifier 84 includes two separate amplifiers which have different characteristics but which work together to provide both high power efficiency and a frequency response which desirably covers the entirety of sub-RF zone 28 (FIG. 2). Bias signal amplifier 120 is desirably configured as a highly agile, differential input, linear amplifier having a bandwidth covering the entirety of sub-RF zone 28. But such linear amplifiers tend to use power inefficiently. Switching amplifier 122 is desirably configured as a highly efficient switching amplifier, which forms a buck converter when coupled with buck inductor 134. But such switching amplifiers tend to exhibit a low bandwidth dictated by the use of a buck inductor 134 having sufficiently high inductance to restrain voltage ripple. In the FIG. 4 embodiment, envelope amplifier 84 may be considered to be a hybrid envelope amplifier which includes both a linear amplifier 120 and a switching amplifier 122 cooperative coupled together.

Current sensor 124 and hysteretic controller 132 control the duty cycle for switching amplifier 122. The duty cycle is controlled so that switching amplifier 122, within the ability of its limited bandwidth, sources an amount of current which causes the current sourced by the highly agile bias signal amplifier 120 to decrease toward zero. In other words, switching amplifier 122 is controlled to supply as much of the current for pre-stabilized bias signal 128 as it can, leaving little or no current for bias signal amplifier 120 to source. As a result, the voltage at first node 126 of RF choke 86 is controlled by bias signal amplifier 120, but the current flowing through RF choke 86 is sourced by switching amplifier 122 to the ability of its limited bandwidth. The highly agile but inefficient bias signal amplifier 120 is primarily responsible for the higher frequency energy portion of pre-stabilized bias signal 128 and the low bandwidth, efficient switching amplifier 122 is primarily responsible for the lower frequency energy portion of pre-stabilized bias signal 128. Since the vast majority of the energy delivered by pre-stabilized bias signal 128 is lower frequency energy, the high efficiency of switching amplifier 122 prevails in the overall efficiency of envelope amplifier 84. But the highly agile bias signal amplifier 120 allows pre-stabilized bias signal 128 to exhibit a bandwidth corresponding to sub-RF zone 28.

Second node 130 of RF choke 86 couples to a first port 140 of feedback section 110, and a second port 142 of feedback section 110 couples to a negative input 144 of differential input section 118 of bias signal amplifier 120. Second node 130 of RF choke 86 also couples to a first node 146 of a conduction channel 148 of RF power amplifier 36. A second node 150 of conduction channel 148 of RF power amplifier 36 couples to ground terminal 138. RF communication signal 78 drives an input node 152 of RF power amplifier 36.

Stabilized bias signal 82 is generated at second node 130 of RF choke 86 through the operation of a control loop 154 that includes bias signal amplifier 20, RF choke 86, and feedback section 110. But RF power amplifier 36 exerts an influence over control loop 154 because stabilized bias signal 82 is applied at an output of a core amplifying device 156, represented in FIG. 1 using a field effect transistor (FET) symbol. FIG. 4 depicts first node 146 of conduction channel 148 as being the drain, second node 150 as being the source, and input node 152 as being the gate. Although not shown in FIG. 4, a suitable DC voltage is desirably used to bias the input of RF power amplifier 36.

Those skilled in the art will appreciate that a wide variety of n-channel or p-channel, short-channel or long-channel, FET amplifying devices, including MOS, CMOS, LDMOS, and the like, may be used as amplifying device 156 and that other types of transistor and tube forms of amplifying devices 156 may also be used. Moreover, while FIG. 4 shows only a single core amplifying device 156 for simplicity, RF power amplifier 36 may use multiple active devices coupled together to serve in the role of amplifying device 156. Examples of such multiple-device structures include a push-pull configuration commonly used for class AB operation, a stack commonly used with CMOS amplifying devices, and a driver stage followed by a final stage. These and other forms of RF power amplifier 36 are intended to be included in the scope of the present invention.

In the configuration depicted in FIG. 4, first conduction channel node 146 serves as the output for RF power amplifier 36, and first conduction channel node 146 couples to an input of output matching network 88. An output of output matching network 88 couples to antenna 90, depicted in FIG. 4 as a resistive load located between output matching network 88 and ground terminal 138. Those skilled in the art will appreciate that RF power amplifier 36 need not follow the simplified architecture depicted in FIG. 4 but that a wide variety of conventional and unconventional RF power amplification architectures may alternatively be used. For example, in a push-pull configuration, a second active device (not shown) may be located between second conductive channel node 150 and either ground terminal 138 or a negative potential. For this push-pull configuration, the output of RF power amplifier 36 may be provided by the junction between the two active devices at second conduction channel node 150, which would couple to output matching network 88.

FIG. 4 depicts the biasing network for conduction channel 148 to include only RF choke 86. Desirably envelope trapping capacitors are avoided as much as possible to reduce memory-effect nonlinearities. From first node 126 of RF choke 86, the output of bias signal amplifier 120 in series with current sensor 124 presents a low impedance to ground at frequencies throughout sub-RF zone 28 (FIG. 2) and throughout fundamental RF zone 16 (FIG. 2). RF choke 86 is desirably configured to substantially attenuate or block the flow of RF current in fundamental RF zone 16 while passing DC current and current at frequencies in sub-RF zone 28 with little or no attenuation.

Those skilled in the art will appreciate that an inductor may be configured to serve as an RF choke, such as RF choke 86. The configuration of an inductor to be an RF choke involves selection of an inductance value and arrangement in a circuit topology. The circuit topology arrangement isolates the low impedance output node of bias signal amplifier 120 from first conduction node 146 of RF power amplifier 36 for frequencies in fundamental RF zone 16. The inductance value selection allows as low of an impedance as possible throughout frequencies in sub-RF zone 28 while providing an impedance much higher than the impedance presented to RF power amplifier 36 by output matching network 88 at frequencies in fundamental RF zone 16. This circuit topology arrangement avoids substantial attenuation of amplified communication signal 34 at conduction node 146 of RF power amplifier 36. Desirably, more than 80%, and preferably more than 90%, of the power of amplified communication signal 34 generated at the output of RF power amplifier 36 passes to antenna load 90 through output matching network 88, while less than 20% and preferably less than 10% of this power passes through RF choke 86 to bias signal amplifier 120.

RF communication signal 78 is amplified by RF power amplifier 36 to form amplified communication signal 35. Amplified communication signal 35 is a composite signal that includes the desired fundamental RF signal 20 (FIG. 2) along with distortion signals 24 and 26 (FIG. 2). Other harmonics may be present as well, but should be less prominent in amplified communication signal 35. As discussed above, while the second harmonic of RF communication signal 78 may be responsible for one form or component of sub-RF distortion signal 26, sub-RF distortion signal 26 may also be formed in other ways as a byproduct of the amplification of RF power amplifier 36. Accordingly, a time-varying voltage V(t) develops across conduction nodes 146 and 150 in response to the amplification operation of RF power amplifier 36 responding to RF communication signal 78, and this voltage V(t) characterizes at least sub-RF distortion signal 26 and fundamental RF signal 20. Voltage V(t) also characterizes biasing provided by envelope amplifier 84 through RF choke 86.

Control loop 154 is configured to cause the portion of voltage V(t) occupying at least envelope tracking bandwidth 58, and preferably occupying substantially all of sub-RF zone 28, to substantially match bias control signal 92. Those skilled in the art will appreciate that control loop 154 may not be able to hold the sub-RF zone 28 portion of voltage V(t) equal to bias control signal 92 with absolute precision due to loop bandwidth limitations and noise limitations, but the sub-RF zone 28 portion of voltage V(t) is desirably held as closely equal to bias control signal 92 as practical.

Control loop 154 causes the sub-RF zone 28 portion of voltage V(t) to substantially match bias control signal 92 due to feedback provided through feedback section 110. Generally, feedback section 110 passes only a portion of composite amplified communication signal 35 to negative differential input 144 of bias signal amplifier 120. In order to maintain high PAE, that portion is a very low power portion compared to the power of composite amplified communication signal 35. In addition to being a low power portion, that portion is the portion that resides in sub-RF zone 28. Accordingly, feedback section 110 includes an isolating section 158 and a filtering section 160. In the embodiment depicted in FIG. 4, isolating section 158 includes a resistive voltage divider 162 coupled between second node 130 of RF choke 86, which may also be viewed as being first conduction node 146 of RF power amplifier 36, and ground terminal 138. A central tap of resistive voltage divider 162 couples to an input of filtering section 160.

In a preferred embodiment, resistive voltage divider 162 is configured to exhibit substantially the same resistances as resistive voltage divider 114. In order to achieve a high PAE, resistive voltage divider 162 is desirably configured to exhibit an impedance to first conduction node 146 of RF power amplifier 36 that is substantially greater throughout fundamental RF zone 16 than the impedance presented by output matching network 88. And, throughout fundamental RF zone 16, the impedance presented to conduction node 146 by resistive voltage divider 162 is also desirably greater than the impedance presented through RF choke 86. Moreover, in order to achieve a high PAE, resistive voltage divider 162 is desirably configured to exhibit an impedance to first conduction node 146 of RF power amplifier 36 that is substantially greater throughout sub-RF zone 28 than the impedance presented through RF choke 86. And, throughout sub-RF zone 28, the impedance presented by resistive voltage divider 162 is also desirably greater than the impedance presented by output matching network 88. The relatively higher impedance presented by isolating section 158 to conduction node 146 throughout sub-RF and fundamental RF zones 28 and 16 allows power amplifier 36 to achieve a high PAE.

In the embodiment depicted in FIG. 4, filtering section 160 includes a plurality of resonant RF traps 164, each with series inductive and capacitive elements mutually tuned to provide as low of an impedance notch as practical to RF fundamental signal 20 (FIG. 2), the second harmonic, or higher harmonics. This embodiment is suited to very wideband communication signals in comparison to RF zone 16 (FIG. 2). Through the operation of filtering section 160, the RF fundamental signal 20 portion of composite amplified communication signal 35 becomes significantly attenuated so that sub-RF zone 28 signals dominate. In other words, filtering section 160 of feedback section 110 is configured to distinguish the sub-RF zone 28 portion of composite amplified communication signal 35 from the fundamental RF zone 16 portion of signal 35, and pass only the sub-RF zone 28 portion to an input of bias signal amplifier 120. Those skilled in the art will appreciate that other filtering elements, such as low pass filters may also be included in filtering section 160 as needed to enhance stability, and/or that a low pass filter may be adapted for use instead of the above-discussed RF traps 164 for many applications. But phase shift and delay for signals within envelope tracking bandwidth 58 (FIG. 2), and preferably within sub-RF zone 28, are desirably held to a minimum.

The sub-RF zone 28 signal provided at second port 142 of feedback section 110 is still a composite signal which includes at least two combined sub-RF zone 28 signals. One of these two sub-RF zone 28 signals is sub-RF distortion signal 26 (FIG. 2) generated by RF power amplifier 36. The other is bias control signal 92. Through the operation of control loop 154, the output of bias signal amplifier 120 will seek the signal level that causes the voltage of stabilized bias signal 82, which is also the portion of voltage V(t) occupying sub-RF zone 28, to match the voltage of bias control signal 92. In other words, through the operation of control loop 154, bias signal amplifier 120 generates a sub-RF zone 28 signal which, after passing through RF choke 86, at least partially cancels sub-RF distortion signal 26 generated by RF power amplifier 36.

Through the operation of control loop 154, the stabilization of stabilized bias signal 82 allows transmitter 32 (FIG. 3) to improve linearity because the reduction of sub-RF distortion signal 26 generated by RF power amplifier 36 likewise reduces the distortion 80 in fundamental RF zone 16 caused by intermodulation between sub-RF distortion signal 26 and RF communication signal 78. This desirable improved linearity result can be achieved in an alternate embodiment where a DC signal may be applied to bias signal amplifier 120 instead of the bias control signal 92 shown in FIG. 4. But the use of a time-varying envelope tracking signal, such as bias control signal 92, also improves PAE over the PAE achievable with other ET, EER, and hybrid RF power amplifier biasing techniques. The PAE improvement is due to the attenuation of sub-RF distortion signal 26, which causes RF power amplifier 36 to operate linearly along a load line closer to optimal load line 14 (FIG. 1).

When using a time-varying bias control signal 92, stabilized bias signal 82 remains a time-varying bias signal occupying sub-RF zone 28. Consequently, intermodulation between stabilized bias signal 82 and RF communication signal 78 may still occur due to imperfect linearity in RF power amplifier 36. This intermodulation results in distortion signal 80 (FIG. 2) occupying fundamental RF zone 16. But distortion signal 80 may be compensated through the operation of predistorter 72 (FIG. 3).

Referring back to FIG. 3, different architectures known to those of skill in the art may be employed for predistorter 72 in transmitter 32. Desirably, the architecture of predistorter 72 is operated at a realistic sampling rate and otherwise configured to consume no more power than is necessary so that transmitter 32 is compatible with battery powered operation. But the sampling rate used for predistorter 72 is desirably greater than the sampling rates that process the communication signal upstream of predistorter 72 because predistorter 72 will expand the bandwidth of the baseband communication signal to roughly that of bandwidth 50 (FIG. 2) or higher.

One example of a predistorter 72 that may be suitable for use in transmitter 32 is described in U.S. Patent Pub. No. 2012/0106676 A1, dated 3 May 2012, entitled "Transmitter Linearized in Response to Signal Magnitude Derivative Parameter and Method Therefor," and assigned to the assignees hereof, which is incorporated by reference in its entirety herein. FIG. 5 shows a simplified block diagram of a predistorter 72 configured essentially in accordance with the teaching of U.S. Patent Pub. No. 2012/0106676 A1, but this specific embodiment is not a requirement in transmitter 32.

As shown in FIG. 5, complex, baseband communication signal 42 drives a magnitude extraction section 166 and a delay element 168. Magnitude extraction section 166 extracts magnitude from complex signal 42 to generate a magnitude signal 170 that drives a derivative calculation section 172 and a delay element 174. Outputs of delay element 174 and derivative calculation section 172 couple to address inputs of a look-up table 176. Delay element 174 delays magnitude signal 170 into synchronism with a magnitude derivative signal 178 generated by section 172 at the address inputs of look-up table 176.

As discussed above, stabilized bias signal 82 (FIGS. 3-4) is a time varying signal that tracks bias control signal 92. And, stabilized bias signal 82 intermodulates with the fundamental RF communication signal 78 to cause at least some of distortion 80 (FIG. 2). To compensate for this form of distortion, bias control signal 92 is delayed in a delay element 180, then applied through another delay element 182 to a separate address input of look-up table 176. In addition, bias control signal 92, after delay in delay element 180, drives a derivative calculation section 184. An output of derivative calculation section 184 couples to another address input of look-up table 176. Delay elements 180 and 182 delay bias control signal 92 into synchronism with magnitude signal 170 and magnitude derivative signal 178 at the address inputs of look-up table 176 and delay the derivative with respect to time of bias control signal 92 into synchronism as well. Based on the four magnitude signal 170, magnitude derivative signal 178, bias control signal 92 and bias control signal derivative inputs to look-up table 176, look-up table 176 determines, on a sample by sample basis, a gain factor 186 by which baseband communication signal 42 should be scaled to appropriately predistort it so that RF power amplifier 36 will apply an inversing distortion 80 (FIG. 2) and cause amplified communication signal 35 (FIGS. 3-4) to appear as a more nearly linearly amplified signal. Thus, gain factor 186 drives a first input of a scaling section 188, and baseband communication signal 42, after being delayed in delay element 168, drives a second input of scaling section 188. Delay element 168 delays communication signal 42 into synchronism with gain factor 186. Scaling section 188 generates predistorted, baseband communication signal 74.

Although not shown, additional circuits may be provided which are responsive to communication signal 42 and to amplified RF communication signal 34 and which cause look-up table 176 to continuously adapt itself toward improving its ability to compensate for nonlinearity of RF power amplifier 10. U.S. Patent Pub. No. 2012/0106676 A1 discusses such adaptation circuits in more detail. Through the operation of predistorter 72, in which look-up table 176 has table address inputs responsive to both bias control signal 92 and the derivative of bias control signal 92, distortion 80, which is at least partially caused by the use of a time-varying, stabilized bias control signal 82, is at least partially canceled.

In summary, at least one embodiment of the present invention provides a linearized transmitter with a linear RF power amplifier biased using a stabilized bias signal. The stabilized bias signal may be a time-varying signal generated to implement an ET, EER, or hybrid biasing technique. In at least one embodiment of the present invention a method for operating such a transmitter is provided. In at least one embodiment of the present invention, a sub-RF distortion signal generated by the RF power amplifier is canceled in the stabilized bias signal. In at least one embodiment, the canceling of the sub-RF distortion signal allows RF power amplifier operation along a load line closer to its optimal load line while maintaining linear operation.

Although the preferred embodiments of the invention have been illustrated and described in detail, it will be readily apparent to those skilled in the art that various modifications and adaptations may be made without departing from the spirit of the invention or from the scope of the appended claims. For example, those skilled in the art will appreciate that the specific functions depicted herein through the use of block diagrams and circuit diagrams, signal charts, and the like may be partitioned in equivalent but different ways than shown and discussed herein. Such equivalent but different ways and the modifications and adaptations which may be implemented to achieve them are to be included within the scope of the present invention. Likewise, while certain operational conditions have been mentioned herein for the purposes of teaching the invention, the invention may be applied in connection with other operational conditions. For example, for an EER implementation, bandwidth reduction section 56 may be omitted, trough-filling section 60 may be moved downstream of predistorter 72, and a limiter may be added downstream of both predistorter 72 and trough-filling section 60 to eliminate the envelope prior to upconversion and application at the gate of RF power amplifier 36. These and other equivalent modifications and adaptations are included within the scope of the present invention.

What is claimed is:

1. A bias-stabilized RF transmitter comprising:
a bias signal amplifier having a input and having an output;
an RF choke having a first node coupled to said output of said bias signal amplifier and having a second node;
an RF power amplifier configured to exhibit a conducting channel having a first node coupled to said second node of said RF choke and having a second node, wherein a voltage V(t) develops across said first and second power amplifier nodes and said voltage V(t) characterizes a time varying signal; and
a feedback section coupled between said RF power amplifier and said input of said bias signal amplifier, said feedback section being configured to provide a signal characterizing a portion of said voltage V(t) to said input of said bias signal amplifier.

2. The bias-stabilized RF transmitter claimed in claim 1 wherein:
said voltage V(t) is responsive to an RF communication signal amplified by said RF power amplifier;
said voltage V(t) characterizes a distortion signal occupying a first bandwidth in which a sub-RF byproduct of amplifying of said RF communication signal resides;
said voltage V(t) additionally characterizes an amplified RF signal occupying a second bandwidth in which said RF communication signal resides;
said transmitter additionally comprises an output matching network coupled to said RF power amplifier; and
said RF choke is configured to pass said first bandwidth signals, and said RF choke is arranged so that substantial attenuation of said amplified RF signal is avoided at said RF power amplifier.

3. The bias-stabilized RF transmitter claimed in claim 1 wherein said portion of said voltage V(t) comprises a reduced bandwidth portion.

4. The bias-stabilized RF transmitter claimed in claim 1 wherein:
said voltage V(t) is responsive to an RF communication signal amplified by said RF power amplifier;
said voltage V(t) characterizes a distortion signal portion residing in a sub-RF bandwidth;
said voltage V(t) additionally characterizes an amplified RF signal portion; and
said feedback section is configured to distinguish said distortion signal portion of said voltage V(t) from said amplified RF signal portion of said voltage V(t).

5. The bias-stabilized RF transmitter claimed in claim 1 wherein:
said transmitter additionally comprises an output matching network coupled to said RF power amplifier;
said voltage V(t) is responsive to an RF communication signal amplified by said RF power amplifier;
said voltage V(t) characterizes a distortion signal occupying a first bandwidth in which a sub-RF byproduct of amplifying of said RF communication signal resides;
said voltage V(t) additionally characterizes an amplified RF signal occupying a fundamental RF bandwidth; and
said feedback section comprises an isolating section configured to present a substantially greater impedance to said first node of said RF power amplifier than is presented by said output matching network throughout said fundamental RF bandwidth and to present a substantially greater impedance to said first node of said RF power amplifier than is presented by said RF choke throughout said first bandwidth.

6. The bias-stabilized RF transmitter claimed in claim 1 additionally comprising:
a switching amplifier having an input coupled to said output of said bias signal amplifier and having an output; and
a buck inductor coupled between said output of said switching amplifier and said first node of said RF choke.

7. The bias-stabilized RF transmitter claimed in claim 6 wherein said switching amplifier is coupled to said output of said bias signal amplifier through a controller that causes said switching amplifier to source an amount of current through said buck inductor which causes current sourced by said bias signal amplifier to be reduced.

8. The bias-stabilized RF transmitter claimed in claim 1 wherein:
said bias signal amplifier is included in an envelope amplifier and is configured as a linear amplifier;
said envelope amplifier additionally includes a switching amplifier having an input responsive to current sourced by said bias signal amplifier and having an output; and
said envelope amplifier additionally includes an inductor having a first node coupled to said output of said switching amplifier and a second node coupled to said first node of said RF choke.

9. The bias-stabilized RF transmitter claimed in claim 1 wherein:
said input of said bias signal amplifier is provided by a first differential input of said bias signal amplifier and said bias signal amplifier has a second differential input;
said RF power amplifier amplifies an RF communication signal exhibiting an envelope; and
an envelope tracking signal which tracks said envelope is provided to said second differential input.

10. The bias-stabilized RF transmitter claimed in claim 9 wherein:
said envelope tracking signal exhibits an envelope tracking bandwidth; and
said bias signal amplifier, said RF choke, and said feedback section form a control loop that causes said voltage V(t) within said envelope tracking bandwidth to substantially match said envelope tracking signal.

11. The bias-stabilized RF transmitter claimed in claim 9 wherein:
said RF power amplifier forms a distortion signal across said first and second power amplifier nodes, said distortion signal occupying a first bandwidth in which a sub-RF byproduct of amplifying of said RF communication signal resides; and
a voltage $V_L(t)$ develops across said RF choke and exhibits first and second voltage components in said first bandwidth, said first component at least partially canceling said distortion signal at said first amplifier node, and said second component substantially matching said envelope tracking signal.

12. The bias-stabilized RF transmitter claimed in claim 9 additionally comprising:
a predistorter configured to generate a baseband predistorted communication signal from which said RF communication signal is formed, wherein said predistorter includes a look-up table having a table input driven by said envelope tracking signal.

13. The bias-stabilized RF transmitter claimed in claim 12 wherein said look-up table has another table input driven by a derivative of said envelope tracking signal.

14. A method of operating a bias-stabilized RF transmitter, said method comprising:
amplifying an RF communication signal in an RF power amplifier to generate an amplified communication signal having a distortion signal portion occupying a first bandwidth in which a sub-RF byproduct of amplifying of said RF communication signal resides and having an amplified RF signal portion occupying a second bandwidth;
generating a time-varying bias signal in a bias signal amplifier, said bias signal being generated to reside in said first bandwidth;
passing said bias signal through an RF choke to said RF power amplifier, said RF choke being arranged to avoid substantial attenuation of said amplified RF signal at said RF power amplifier;
combining said distortion signal and said amplified RF signal with said bias signal at a conduction node of said RF power amplifier to form a composite signal; and
feeding a signal characterizing a portion of said composite signal residing in said first bandwidth to an input of said bias signal amplifier to form a control loop which configures said bias signal to cancel said distortion signal at said conduction node.

15. The method claimed in claim 14 additionally comprising:
coupling an input of a switching amplifier to an output of said bias signal amplifier; and
coupling a buck inductor between an output of said switching amplifier and said output of said bias signal amplifier.

16. The method claimed in claim 15 wherein an input of said switching amplifier is coupled to said output of said bias signal amplifier so that an amount of current sourced by said switching amplifier and flowing through said buck inductor causes current sourced by said bias signal amplifier to be reduced.

17. The method claimed in claim 14 wherein:
said input of said bias signal amplifier is provided by a first differential input of said bias signal amplifier, and said bias signal amplifier has a second differential input; and
said method additionally comprises providing to said second differential input an envelope tracking signal which tracks an envelope of said RF communication signal.

18. The method claimed in claim 17 additionally comprising generating a baseband predistorted communication signal from which said RF communication signal is formed in a predistorter, wherein said predistorter includes a look-up table having a table input driven by said envelope tracking signal.

19. The method claimed in claim 18 wherein said look-up table has another table input driven by a derivative of said envelope tracking signal.

20. A bias-stabilized RF transmitter comprising:
an RF power amplifier configured to amplify an RF communication signal to generate an amplified communication signal having a distortion signal portion occupying a first bandwidth in which a sub-RF byproduct of amplifying of said RF communication signal resides and having an amplified RF signal portion occupying a second bandwidth;
a bias signal amplifier configured to generate a time-varying bias signal occupying said first bandwidth;
an RF choke coupled between said bias signal amplifier and said RF power amplifier, said RF choke being configured to pass said bias signal from said bias signal amplifier to said RF power amplifier, and said RF choke being arranged so that substantial attenuation of said amplified RF signal is avoided at said RF power amplifier;
a node common to said RF choke and said RF power amplifier where said distortion signal and said amplified RF signal are combined with said bias signal to form a composite signal; and
a feedback section coupled between said node and an input of said bias signal amplifier, said feedback section being configured to feed a signal characterizing a portion of said composite signal which occupies said first bandwidth to said input of said bias signal amplifier to form a control loop which configures said bias signal to cancel said distortion signal at said node.

* * * * *